US011456746B2

(12) United States Patent
Wahl et al.

(10) Patent No.: US 11,456,746 B2
(45) Date of Patent: Sep. 27, 2022

(54) SINGLE PHASE ANALOG COUNTER FOR A DIGITAL PIXEL

(71) Applicant: RAYTHEON COMPANY, Waltham, MA (US)

(72) Inventors: Richard E. Wahl, Lubbock, TX (US); Joshua J. Cantrell, Goleta, CA (US); John L. Vampola, Goleta, CA (US); Micky R. Harris, Lompac, CA (US)

(73) Assignee: RAYTHEON COMPANY, Waltham, MA (US)

( * ) Notice: Subject to any disclaimer, the term of this patent is extended or adjusted under 35 U.S.C. 154(b) by 135 days.

(21) Appl. No.: 16/749,295

(22) Filed: Jan. 22, 2020

(65) Prior Publication Data

US 2021/0226638 A1    Jul. 22, 2021

(51) Int. Cl.
| H03K 21/38 | (2006.01) |
| G01J 1/46 | (2006.01) |
| H04N 5/378 | (2011.01) |
| G01J 1/44 | (2006.01) |
| H03M 1/34 | (2006.01) |

(52) U.S. Cl.
CPC .............. *H03K 21/38* (2013.01); *G01J 1/44* (2013.01); *G01J 1/46* (2013.01); *H04N 5/378* (2013.01); *H03M 1/34* (2013.01)

(58) Field of Classification Search
CPC ... H03K 21/38; H03K 5/01; G01J 1/46; G01J 1/44; G01J 2001/446; H03M 1/34; H03M 1/50; H03M 1/60; H04N 5/378
See application file for complete search history.

(56) References Cited

U.S. PATENT DOCUMENTS

| 9,628,105 | B1 * | 4/2017 | Veeder | H04N 5/378 |
| 9,674,471 | B1 | 6/2017 | Boemler | |
| 10,079,986 | B1 * | 9/2018 | Hairston | H04N 5/378 |
| 2008/0253498 | A1 * | 10/2008 | Dupont | G01J 5/24 377/19 |
| 2020/0412991 | A1 * | 12/2020 | Ishii | G01S 7/4873 |

FOREIGN PATENT DOCUMENTS

CN            102169019 A  *  8/2011  ............... G01J 1/46

OTHER PUBLICATIONS

Maciu, et al. "Sub-Nanosecond Gated Photon Counting for High Spatial Resolution CMOS Imagers". 2016 14th IEEE International New Circuits and Systems Conference (Newcas), IEEE, Jun. 26, 2016, pp. 1-4.

(Continued)

Primary Examiner — Jennifer D Bennett
(74) Attorney, Agent, or Firm — Cantor Colburn LLP

(57) ABSTRACT

An analog counter circuit for use with a digital pixel includes: an input; an output; a first stage electrically coupled to the input that is charged to an initial charge voltage; a second stage that includes an accumulating charge storage device; and a charge transfer device between the first and second stages that includes a transfer voltage. The charge transfer device allows charge from the first stage to pass to the second stage and be accumulated on the accumulating charge storage device as long as a voltage at a node in the first stage is greater than the transfer voltage.

17 Claims, 9 Drawing Sheets

(56) References Cited

OTHER PUBLICATIONS

Notification of Transmittal of the International Search Report of the International Searching Authority, or the Declaration; PCT/US2020/060829; dated Feb. 19, 2021, 5 pages.
Notification of Written Opinion of the International Searching Authority, or the Declaration; PCT/US2020/060829; dated Feb. 19, 2021, 14 pages.
Panina, et al. "Compact CMOS Analog Counter for SPAD Pixel Arrays". IEEE Transactions on Circuits and Systems-II: Express Briefs, vol. 61, No. 4, Apr. 2014 pp. 214-218.
Peizerat, et al. "An analog counter architecture for pixel-level ADC", IISW P21, 2009, 3 pages.
Schultz, et al. "Digital-Pixel Focal Plane Array Technology" Lincoln Laboratory Journal, vol. 20, No. 2, 2014, pp. 36-51.

\* cited by examiner

SINGLE PHASE ANALOG COUNTER FOR A DIGITAL PIXEL

BACKGROUND

The present disclosure relates to a digital pixel imager and, in particular, an analog counter for a digital pixel.

In legacy analog imagers, particularly infrared imagers, photocurrent from a detector diode is integrated by a well capacitor coupled to the detector diode, and then once per video frame, the voltage or charge of each well capacitor is transferred to a downstream analog-to-digital converter (ADC), where the voltage is converted to a binary value. Pixel sizes continue to shrink and the ratio of well capacitor to pixel area shrinks disproportionately more. Simultaneously, there is a demand by consumers for increased Signal-to-Noise Ratio (SNR) which can be realized by increasing effective well capacitance.

In-pixel ADC imagers are used to address this problem associated with decreasing pixel size. In particular, in-pixel ADC imaging improves photo-charge capacity for infrared imaging and other applications as the size of pixels continues to decrease. A good in-pixel ADC design can store nearly all of the available photo-charge from a detector diode and thus improve SNR to near theoretical limits. A common method of integration for in-pixel ADC circuits uses a quantizing analog front end circuit which accumulates charge over a relatively small capacitor, trips a threshold and is then reset. This pattern is repeated as more photo-current integrates.

An example of an in-pixel ADC circuit 100 is illustrated in FIG. 1. Charge from a photodiode 110 is accumulated over an integration capacitor 115. As charge is accumulated across the integration capacitor 115 it is compared to a threshold voltage (Vref) by a comparator 120. When the voltage across the integration capacitor 115 (referred to as Vint herein) exceeds Vref the circuit 100 is reset via a reset switch 130 that receives a control signal Reset from the comparator 120. During a reset, a voltage equal to the difference between Vref and Vreset is subtracted from the integration capacitor 115. Vreset can be referred to as a base voltage herein.

Control of the flow of current from the photodiode 110 is controlled by an injection transistor 112. The gate of the injection transistor 112 is coupled to a bias voltage Vbias. The level of this voltage can be selected by the skilled artisan and is used, in part, to keep the photodiode 110 in reverse bias where the voltage at node 114 is lower than the diode supply voltage Vdiode. If the voltage at node 114 exceeds Vbias, current created in the photodiode 110 is allowed to pass through the injection transistor 112 for accumulation by the integration capacitor 115.

Each reset event is accumulated (counted) with a counter circuit 135. In some instances the counter circuit 135 is a digital circuit but in others and as discussed further below, the counter circuit 135 can be an analog circuit.

After the integration time expires, the "count" accumulated on the counter circuit 135 can be read out. Also, any residual charge accumulated on the integration capacitor 115 can be read out by, for example, a single slope ADC or any other type of ADC. Such operations are known in the prior art.

The example in-pixel ADC circuit 100 illustrated in FIG. 1 is an asynchronous circuit. In asynchronous in-pixel ADCs, the comparator reset event occurs as soon as the voltage on the integration capacitor 115 crosses the comparator threshold.

SUMMARY

According to a first embodiment, an analog counter circuit for use with a digital pixel is disclosed. The analog counter circuit of this embodiment includes: an input; an output; a first stage electrically coupled to the input that is charged to an initial charge voltage; a second stage that includes an accumulating charge storage device; and a charge transfer device between the first and second stages that includes a transfer voltage. The charge transfer device allows charge from the first stage to pass to the second stage and be accumulated on the accumulating charge storage device as long as a voltage at a node in the first stage is greater than the transfer voltage.

In any prior embodiment, when a RESET signal is received at the input transitions from a low level to a high level, the voltage at the node rises from the initial charge voltage to a charge voltage, wherein the charge voltage is a sum of the initial charge voltage and an amplitude of the RESET signal.

In any prior embodiment, the transfer device includes an input connected to the first stage and an output connected to the second stage.

In any prior embodiment, the transfer device includes a gate that is connected to a gate bias voltage, wherein the transfer voltage is a sum of the gate bias voltage and a threshold voltage of the transfer device.

In any prior embodiment, the transfer device is a P-channel MOSFET.

In any prior embodiment, the first stage includes: a first capacitor connected to the input; and a charge control device having an input connected to a supply voltage and an output connected to the first capacitor. The output of the charge control device and the first capacitor can be connected to the charge transfer device.

In any prior embodiment, the charge control device is a diode connected P-channel MOSFET.

In any prior embodiment, the charge control device is a diode connected N-channel MOSFET.

In any prior embodiment, the charge control device is a diode.

In any prior embodiment, the charge control device is an N-channel MOSFET. In this embodiment, a gate of the N-channel MOSFET can be connected to an inverse of the RESET signal or to biasing gate control voltage.

Also disclosed is a digital pixel that includes: a photocurrent source; an injection transistor connected to the photocurrent source; an integration capacitor connected between the injection transistor and a reset voltage; a comparator having inputs connected to the injection transistor and to a reference voltage, the comparator having an output on which it provides an output RESET signal that has either a high or low value based on a relationship between the reference voltage and a voltage on the integration capacitor; and an analog counter connected to the output of the comparator. The analog counter can be any analog counter disclosed above.

Also disclosed is a method of using an analog counter in a digital pixel circuit. The method includes: receiving a RESET signal at input to the analog counter from a comparator operatively connected to a photo-current source through an injection transistor and to an integration capacitor, the RESET signal having low value and high value; charging a first storage device to initial charge voltage when the RESET signal has a low value; and transferring charge stored on first storage device to an accumulating charge storage device through a charge transfer device connected between the first storage device and the accumulating charge storage device when the RESET transitions from the low value to the high value for long as a voltage at a node between the first storage device and the charge transfer device is greater than a transfer voltage of the charge transfer device.

In any prior method embodiment, the transfer device includes an input connected to the first storage device an output connected to the accumulating charge storage device and a gate that is connected to gate bias voltage, wherein the transfer voltage is a sum of the gate bias voltage and the threshold voltage of the transfer device.

In any prior method embodiment, charging includes passing charge from a supply voltage to the first storage device connected the input of the analog counter through a charge control device having an input connected to the supply voltage and an output connected to the first storage device.

In any prior method embodiment, the charge control is a diode connected P-channel MOSFET, a diode connected N-channel MOSFET or a diode.

In any prior method embodiment, the charge control device is an N-channel MOSFET.

In any prior method embodiment, charging includes one of: providing an inverse of the RESET signal to a gate of the an N-channel MOSFET; and providing a biasing gate control voltage to the gate of the an N-channel MOSFET.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

The diagrams depicted herein are illustrative. There can be many variations to the diagram or the operations described therein without departing from the spirit of the invention. For instance, the actions can be performed in a differing order or actions can be added, deleted or modified.

Also, the term "coupled", "connected" and variations thereof, describe having a conductive path between two elements. Unless specifically called out in the claims that may eventually issue here from, such terms do no imply a direct connection between the elements with no intervening elements/connections between them. However, when elements are described herein as "connected" or "coupled" the elements can be understood to as being described to include either being directly or indirectly connected/coupled. All of these variations are considered a part of the specification.

DETAILED DESCRIPTION

Figure 1:
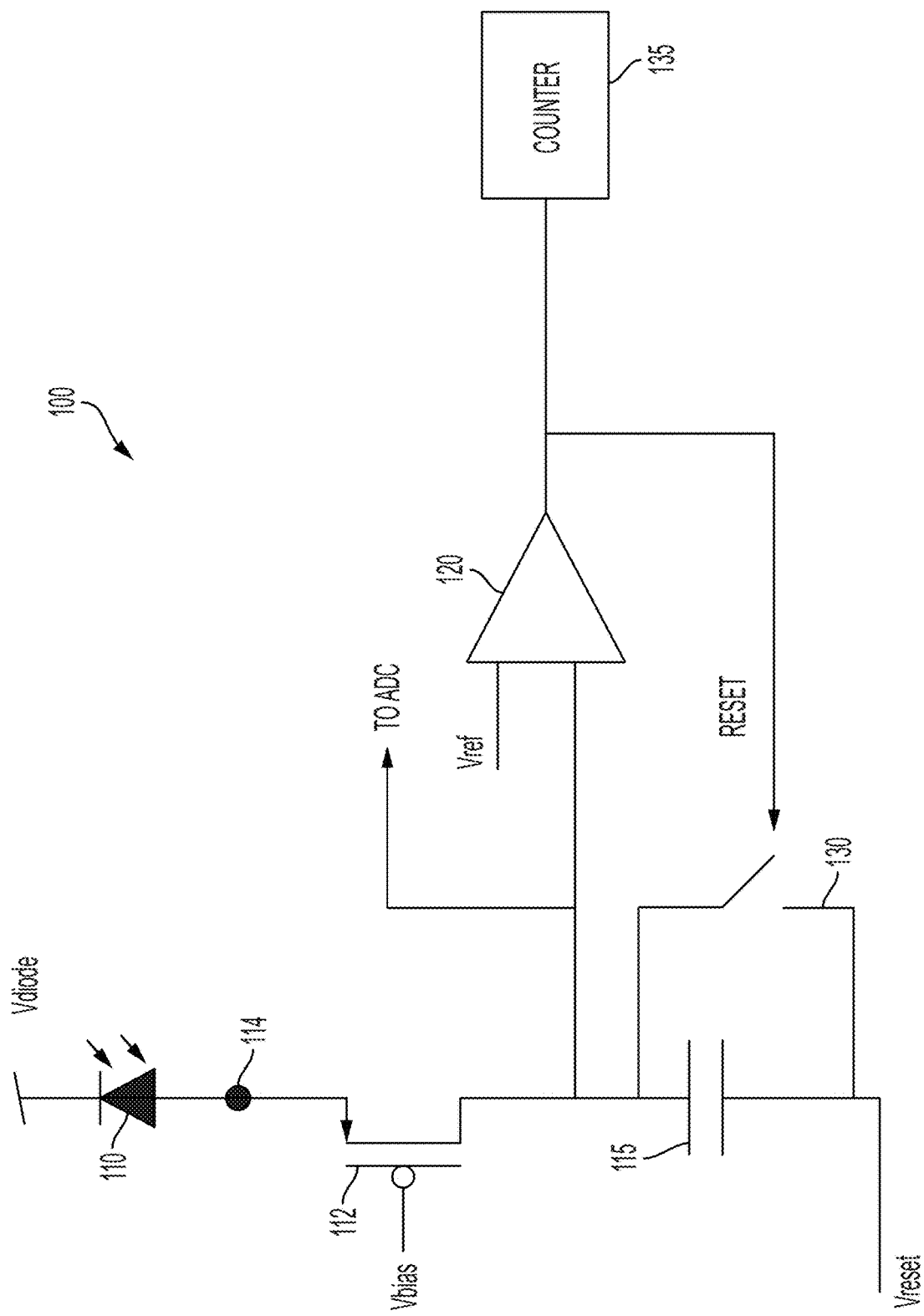
FIG. 1 is a schematic diagram illustrating a prior art in pixel analog-to-digital converter (ADC) circuit.

Disclosed herein is an analog counter that can used, for example, as the counter 135 in FIG. 1. The analog counter transfers a fixed amount of charge from a "small" capacitor to a larger capacitor each time RESET goes high. As such, the analog circuit operates in a "bucket brigade" manner. The RESET signal represents the only clocking of the counter needed to make such a transfer as compared to the prior art where a two-phase non-overlapping clock was required.

Figure 2:
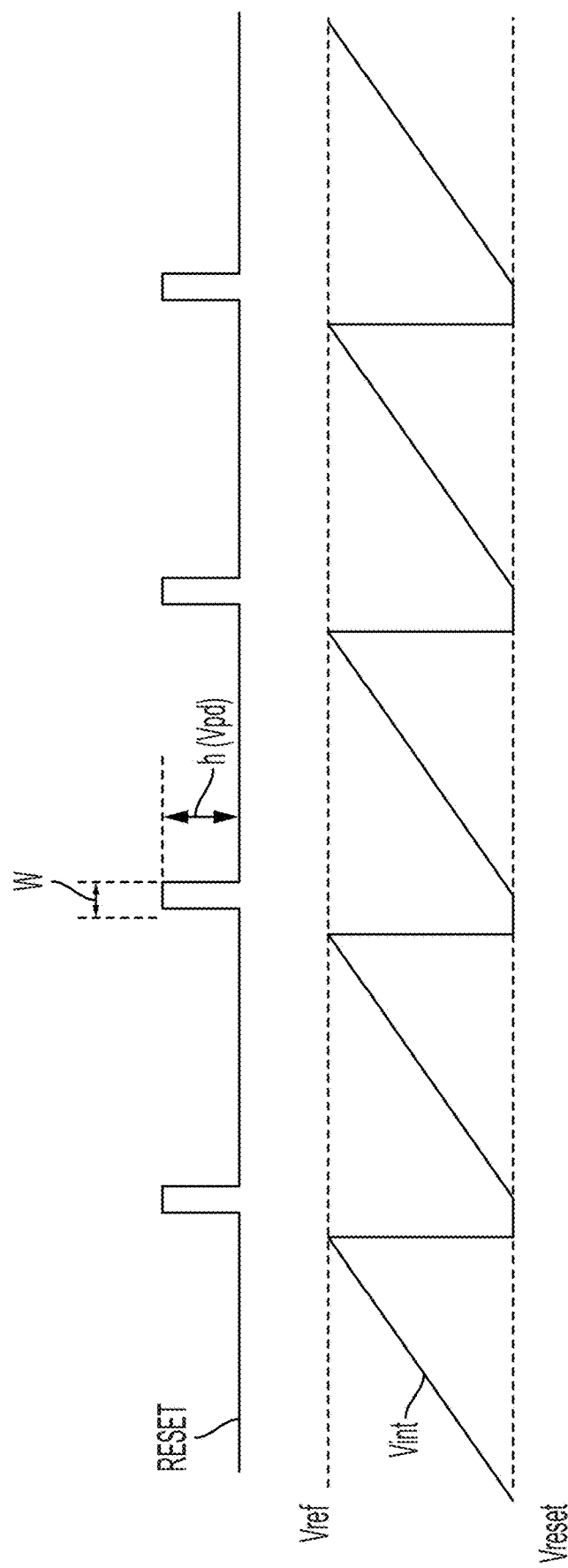
FIG. 2 is a graph illustrating voltage levels corresponding to operation of the ADC circuit of FIG. 1.

FIG. 2 is waveform diagram illustrating the various voltage or signal values during operation of the circuit in FIG. 1. As can be seen during, each time Vint meets or exceeds Vref, an output pulse is generated on RESET. The output pulse is generated at the output of the comparator 120. This pulse can be called a comparator reset or recycle pulse herein. That pulse has a height h and width w. Depending on the type of comparator 120 used, h and w can be variable. Herein disclosed is an analog counter that may operate independent of the pulse width w. The height of the pulse can also be referred to as Vpd herein and represents the change in potential provided at the input to the analog counters discussed herein when the comparator 120 generates RESET pulses.

By providing for an "analog" counter, embodiments herein can allow for the creation of high dynamic range pixels viable in older but cheaper technologies such as 180 nm and 130 nm. The counter can be implemented as a single/multiple phase architecture to charge up the small capacitor when RESET is low and, after the small capacitor is fully charged it is ready and waiting for RESET to rise to enable the transfer a fixed amount of that charge to a larger accumulating charge storage device (e.g., a larger capacitor). The amount transferred can be set as will be more fully understood from the below based on inputs to a charge transfer device located between the small and large capacitors.

Having the rise of RESET enable the transfer allows for the same amount of charge to be transferred independent of the amount of time RESET is enabled (e.g., regardless of the pulse width w). As will be understood more fully from the below discussion, the amount of charge transferred on each pulse of RESET is constant and the counter can be implemented with multiple different configurations of N-type and P-type transistors.

Figure 3:
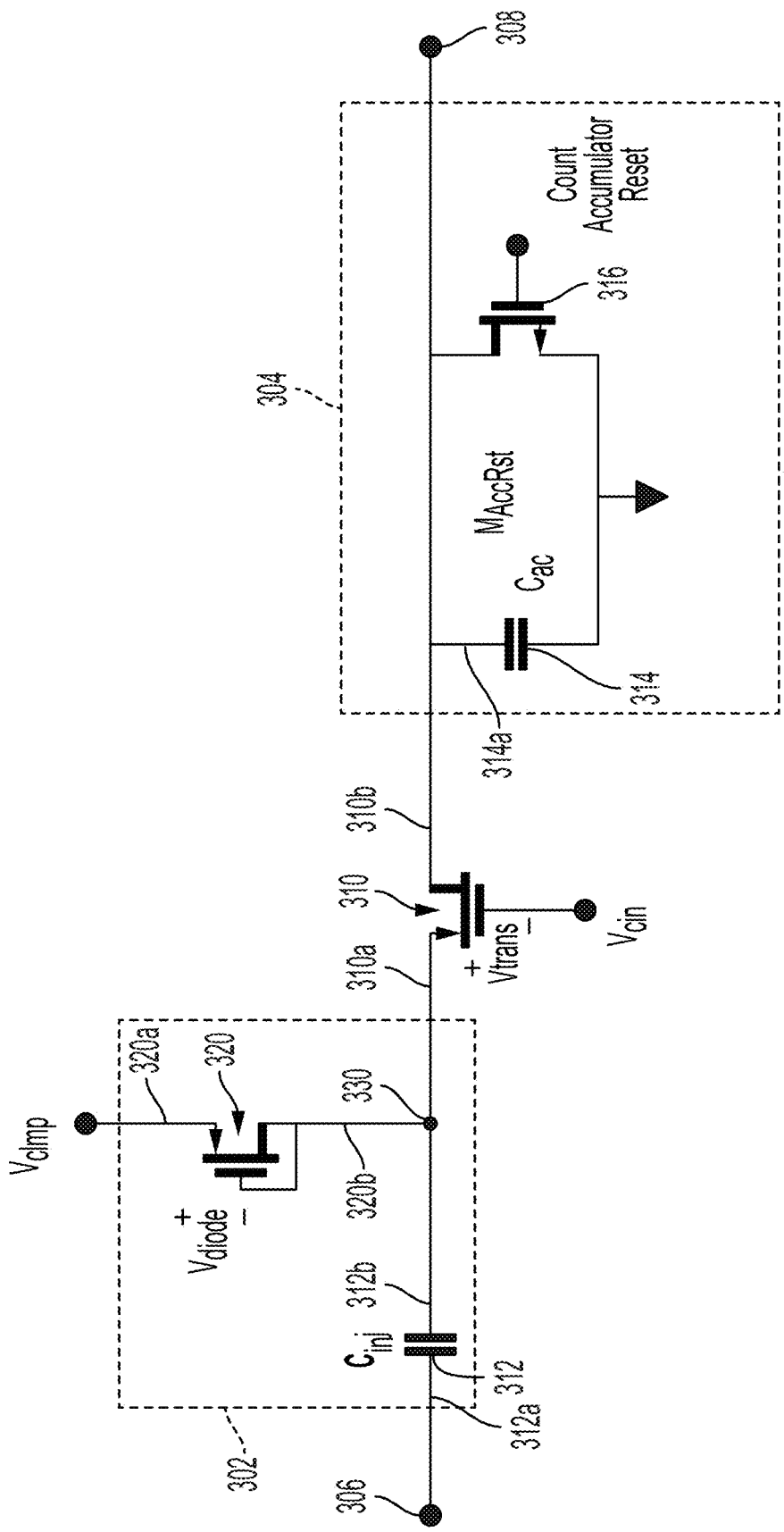
FIG. 3 is a circuit diagram of an analog counter that can used as the counter shown in FIG. 1.

FIG. 3 shows an example of an analog counter 300 according to one embodiment. The counter 300 can be used, for example, as the counter 135 of FIG. 1. That same is true for all later disclosed embodiments. The counter 300 includes a first stage 302 and a second stage 304. Charge is accumulated in the first stage 302 and a fixed portion thereof transferred to the second stage 304 each time a RESET pulse is received at an input 306 to counter 300. To that end, the input 306 can be connected either directly or indirectly to the output of the comparator 120 of FIG. 1 and is electrically coupled to the first stage 302 in one embodiment. The counter 300 also includes an output 308 that is electrically coupled to the second stage 304. Each time charge is transferred from the first stage 302 to the second stage 304 that charge is accumulated on a charge accumulating element such as a charge accumulating capacitor as more fully discussed below. A charge transfer device 310 is located between the first and second stages 302, 304 and controls the transfer of charge from the first stage 302 to the second stage 304.

In more detail, in operation, each of the embodiments discussed herein can include a first (or small) charge storage device (such as a capacitor) that is charged to first fixed level when RESET is low. A fixed amount of the charge is transferred through the charge transfer device 310 (such as an MOSFET or FET) to a larger charge storage device (e.g., a second capacitor) each time a reset/comparator reset/recycle pulse rises from its nominal state. That is, in the case where the RESET signal is low when Vint is less than Vref, the small charge storage device is charged when RESET is low and the fixed charge is transferred to the other/large charge storage device when the RESET transitions from low to high (e.g., from a logical 0 to a logical 1). In terms of the above description, the first or small charge storage device can be in the first stage 302 and the second larger charge storage device can be in the second stage 304. The process continues for a frame length in one embodiment. As will be understood, at the end of the frame, the large charge storage device will have charge stored thereon that is roughly equal to the number of reset pulses that occurred in the frame times the amount of fixed charge transfer.

Referring back to FIG. 3, the counter 300 as shown utilizes capacitors as the small and large (accumulating) charge storage devices and, thus, includes a first capacitor 312 in the first stage 302 and a second capacitor 314 in the second stage 304. The second capacitor 314 is larger than the first capacitor 312 can hold much more charge than the first capacitor 312. The input and output of the counter 300 are, as above, identified as input 306 and output 308. The input 306 receives a reset/comparator reset/recycle pulse from, for example, the comparator 120 shown in FIG. 1. For simplicity, the signal received at the input 306 will be referred to as a RESET signal.

As discussed above, each time the RESET signal transitions from a low state to a high state, a fixed amount of the charge in the first (or small) capacitor 312 is transferred into an accumulating charge storage device in the second stage 304. As shown, the accumulating charge storage device 314 is implemented as a second (or large) capacitor 314. The total amount of charge stored on the second capacitor 314 will, thus, be proportional to the number of times the comparator 120 of FIG. 1 produces an output pulse during a particular frame. The amount of charge transferred from the first capacitor 312 to the second capacitor 314 will be referred to as Vstep herein. A magnitude of Vstep can be controlled by setting a bias voltage applied to the charge transfer device 310 discussed below. While not shown, the output 308 can be connected to an off-chip ADC to convert the charge stored into the second capacitor 314 into a digital value at the end of a frame for further processing.

As discussed above, the charge transfer device 310 controls the transfer of charge from the first capacitor 312 to the second capacitor 314. As shown, the charge transfer device 310 is a MOSFET but other types of transistors/switches/controllers can be used. The charge transfer device 310 can be biased by a count input voltage Vcin. The charge transfer device 310 is connected directly to both the first capacitor 312 and the second capacitor 314 as shown but in some instances, other elements could be connected between the first capacitor 312 and the charge transfer device 310 and/or between the charge transfer device 310 and the second capacitor 314 without departing from the disclosure herein. The second capacitor 314 is connected (in series) between the charge transfer device 310 and a ground or reference voltage.

The first stage 302 can also be called a charging stage and includes a charge control device 320 that is utilized to control the flow of charge from a supply voltage Vclmp to the first capacitor 312 when the signal received at the input 306 is low. The charge control device 320 is connected between the supply voltage Vclmp and the first capacitor 312. The charge control device 320 can be, for example, a PMOS diode as shown in FIG. 3 but other types of charge control devices could be implemented. For example, the charge control device could be NMOS an NMOS diode and a programmable NMOS diode biased by an external voltage.

Regardless of how the charge control device 320 is implemented, when RESET is low, the voltage at the input 306 is essentially ground. In such a state, an input of charge control device 320 is connected to the supply voltage Vclmp and the output of the charge control device is connected to ground (input 306) through the first capacitor 312. This allows for charge to accumulate on the first capacitor 312. The charge control device 320 has a threshold value that must be reached before it is conductive. In FIG. 3 that is shown as Vdiode. Thus, when RESET is low, the first capacitor 312 will be charged to a level that is approximately equal to supply voltage Vclmp minus Vdiode. This value can be referred to as a charge voltage level herein. The charge on the first capacitor 312 is shown as Vhold in FIG. 4 and measured at node 330.

Figure 4:
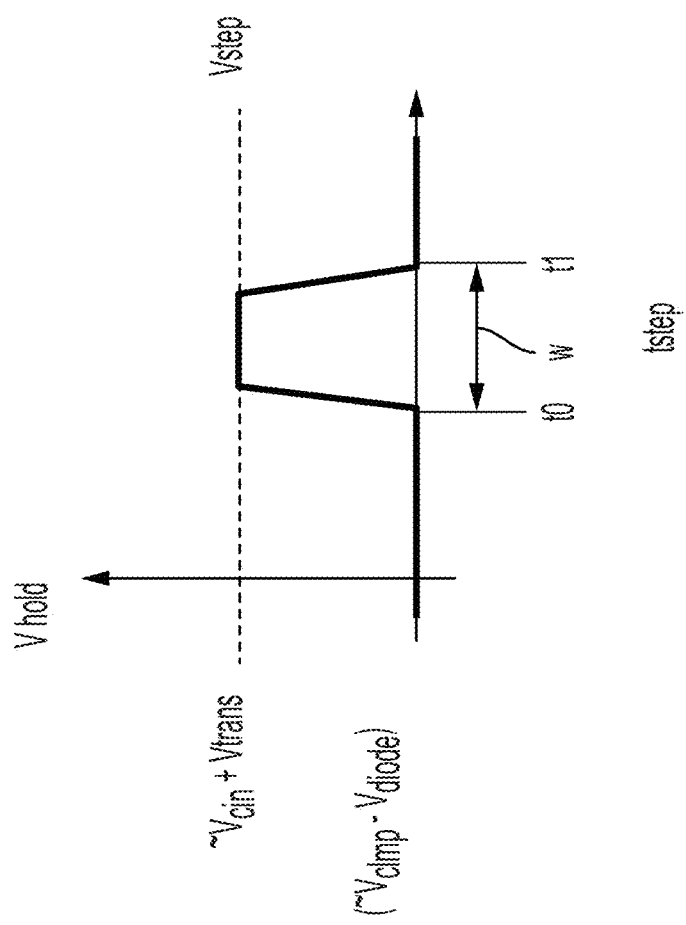
FIG. 4 shows voltages of a node (Vhold, 330) in the circuit of FIG. 3 as a RESET signal transitions form low to high and back to low.

In FIG. 4 the relation of RESET and the voltage (Vhold) at node 330 is illustrated. At time t0 the signal RESET signal provided to the input 306 goes high. Before that time, the Vhold was approximately Vclmp−Vdiode. When the RESET goes high, Vhold is driven up a voltage that is equal to its initial charge voltage (Vclmp−Vdiode) plus the magnitude of RESET. In this case, the magnitude (h) of RESET is represented by the value VpD. Thus, shortly after time t0, Vhold is at a value of VpD+(Vclmp−Vdiode). The quantity Vclmp−Vdiode may be referred to as a charge voltage herein and in general, while RESET is low, Vhold is charged to that level due to the connection Vclmp to the first capacitor 312 through the charge control device 320.

Referring back to FIG. 3, the charge transfer device 310 is shown as a P-channel MOSFET (PMOS). Of course, other types of devices could be used. The charge transfer device 310, regardless of how formed, will include a turn on threshold. In FIG. 3, that turn on threshold is illustrated as Vtrans. When the threshold (Vtrans) is exceeded, the charge transfer device 310 will conduct or otherwise allow for the transmission of charge.

In the particular instance shown in FIG. 3, when the voltage at the SOURCE of the charge transfer device 310 is greater than a bias voltage (Vcin) on the GATE of the charge transfer device 310, charge will pass form the SOURCE to the DRAIN of the charge transfer device 310. The sum of the bias voltage (Vcin) and the threshold Vtrans will be referred to as a transfer voltage herein. While the charge transfer device 310 is shown as a PMOS, the skilled artisan could implement the charge transfer device 310 as an NMOS.

With reference again to FIGS. 3 and 4, the graph of FIG. 4 illustrates that when RESET goes high, Vhold rises to the charge voltage (VpD+(Vclmp−Vdiode)). Before RESET goes high, the voltage at node 330 is at the initial charge voltage. As long as the charge voltage exceeds the voltage required to cause the charge transfer device 310 to allow charge to pass through it (e.g., the transfer voltage (Vcin+ Vtrans)), the charge in the first capacitor 312 (Vhold) will discharge through the charge transfer device 310 and be accumulated on the accumulating charge storage device (e.g., the second capacitor 314). The amount of charge transferred (Vstep) can, thus, be controlled by setting Vcin. In FIG. 4 it is shown that because the transfer stops at time tstep, Vstep is independent of the width (w) of the RESET signal.

The second stage 304 includes the accumulating charge storage device 314 that is implemented as a second capacitor that has a greater charge storage capacity that the first capacitor 312. The second capacitor 314 is connected between the charge transfer device 310 and ground. The connection can be direct or indirect. A reset switch 316 is connected in parallel with the second capacitor 314 and, when conductive, can be used to clear charge stored on the second capacitor 314 (e.g., at the end of a frame).

For completeness and not by way of limitation, certain connections of the circuit in FIG. 3 will now be specifically discussed. The first capacitor 312 includes a first end 312a connected to the input 306 and a second end 312b connected to an output 320b of the charge control device 320 and to the charge transfer device 310. The charge control device 320 includes an input 320a connected to the source voltage Vclmp. The second end 312b of the first capacitor 312 and the output 320b of the charge control device 320 are connected to node 330. As shown, node 330 is connected to a first side 310a of the charge transfer device 310. A second side 310b of the charge transfer device 310 is connected to a first side 314a of the second capacitor 314. A second side 314b of the second capacitor 314 is connected to ground. The reset switch 316 is connected in parallel with the second capacitor 314. As shown, the second capacitor 314 is connected between the first side 314a of the second capacitor 314 and a reference voltage/ground and between the output 308 and a reference voltage/ground.

Figure 5:
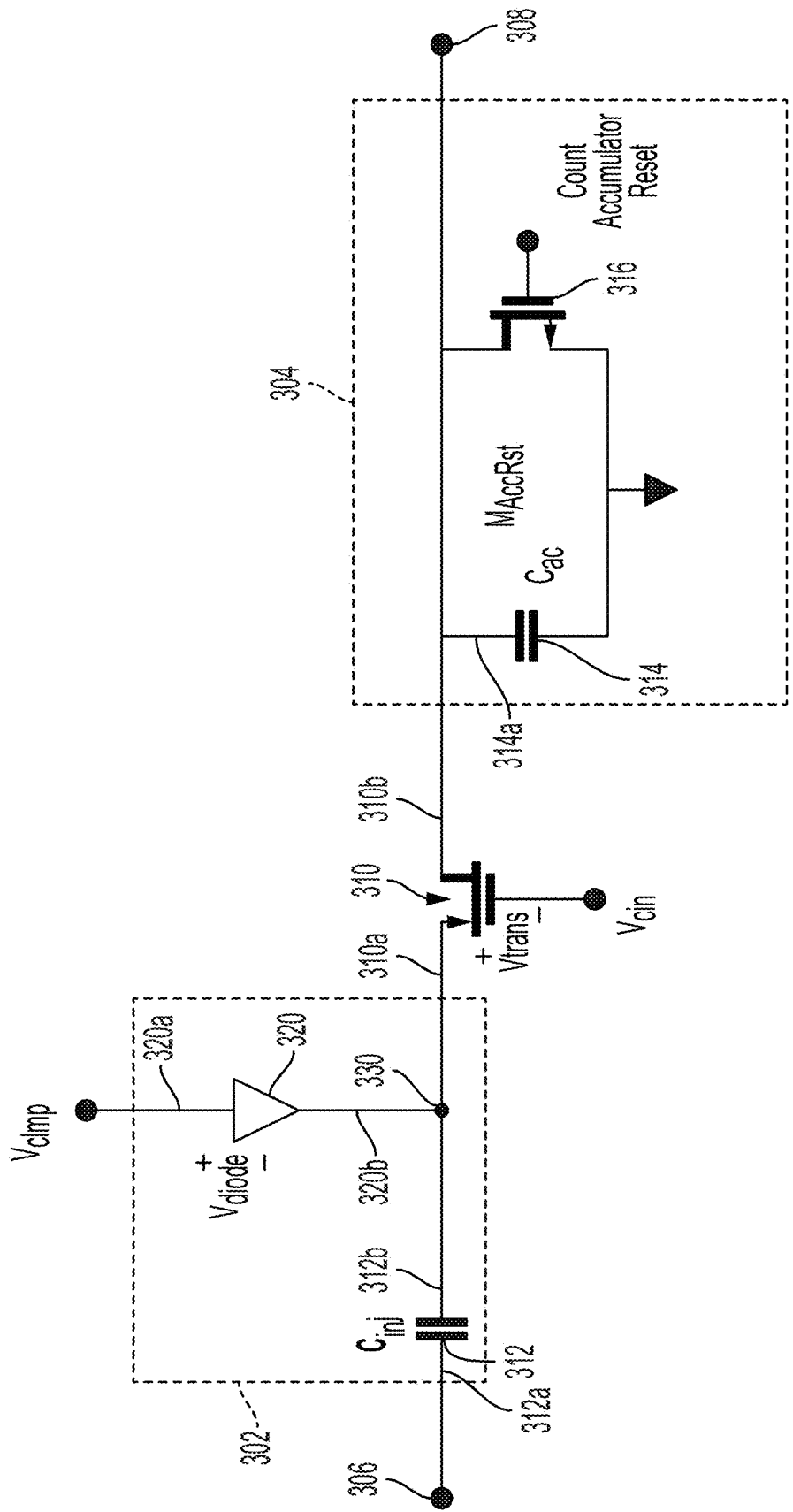
FIG. 5 is a circuit diagram of an analog counter where the charge control device of FIG. 3 is implemented as a diode.

With reference now to FIG. 5, an analog counter is shown that operates in substantially the same manner as that of FIG. 3 but has the charge control device 320 implemented as a diode. Such a device will operate in the same manner as described above.

Figure 6:
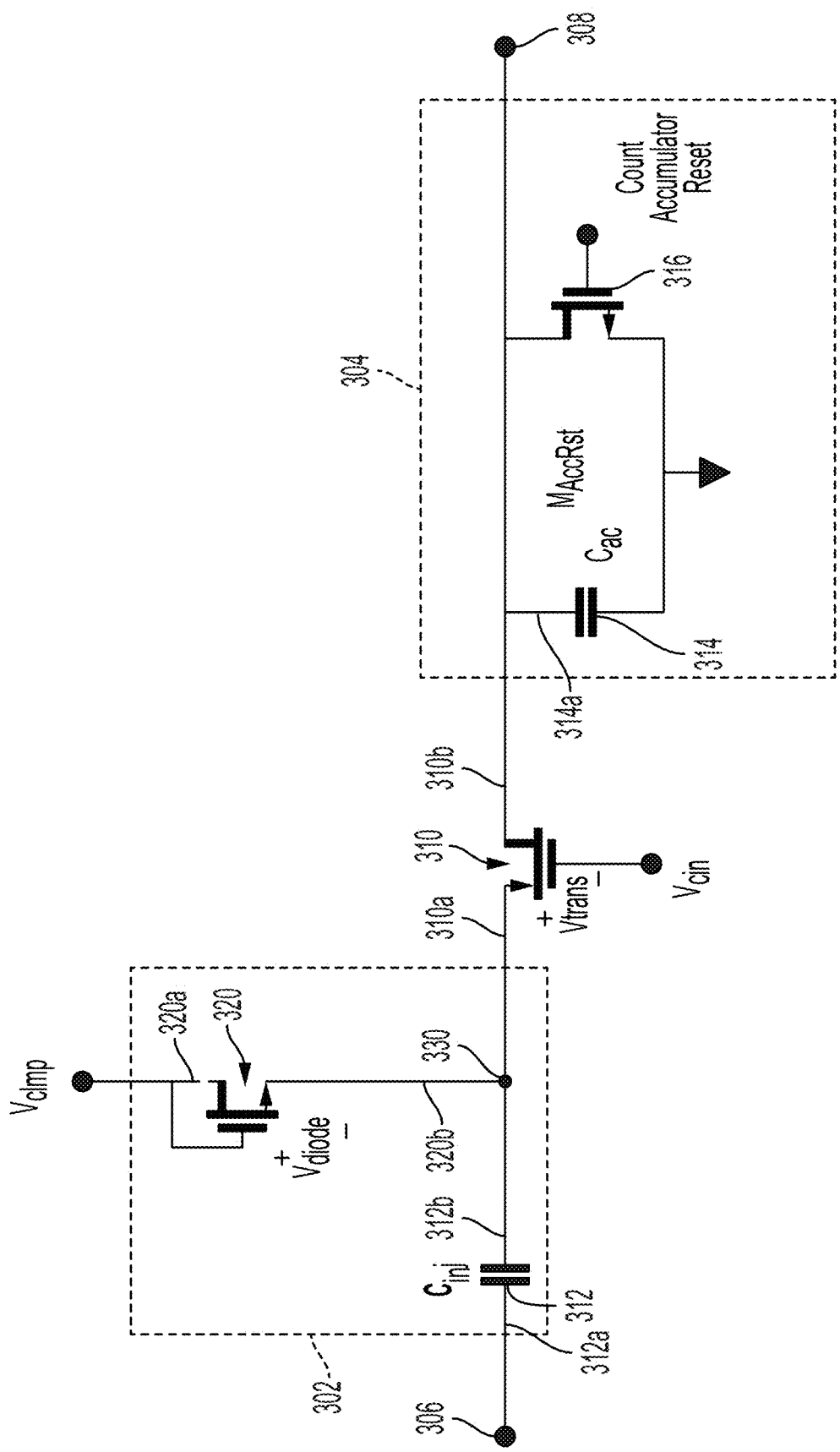
FIG. 6 is a circuit diagram of an analog counter where the charge control device of FIG. 3 is implemented a diode connect N-channel MOSFET.

With reference to FIG. 6, an analog counter is shown that operates in substantially the same manner as that of FIG. 3 but has the charge control device 320 implemented as a diode connected N-channel MOSFET. Such a device will operate in the same manner as described above.

Figure 7:
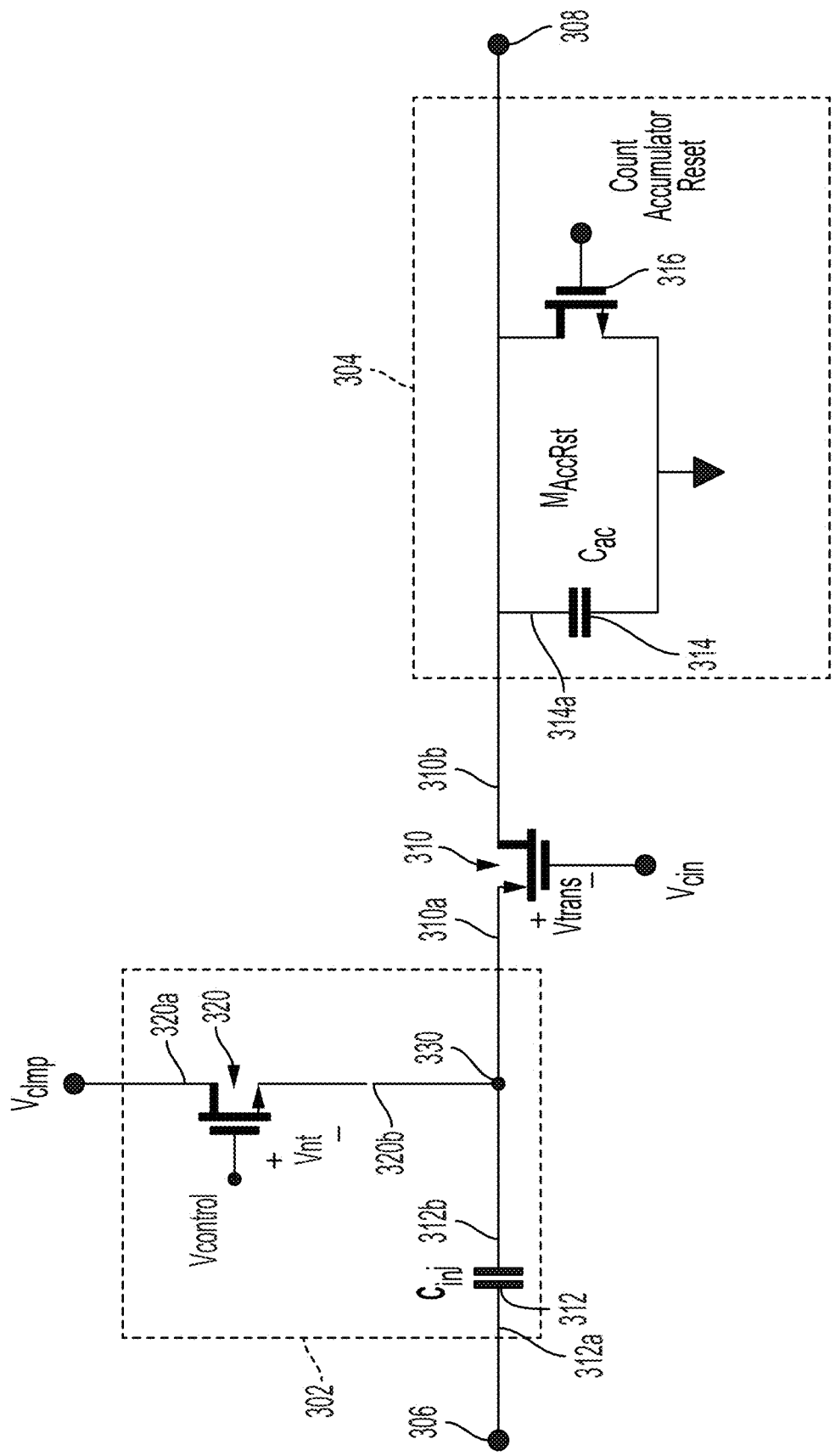
FIG. 7 is a circuit diagram of an analog counter where the charge control device of FIG. 3 is implemented as an N-channel MOSFET that includes a biasing gate voltage.

In another embodiment, and with reference now to FIG. 7, the charge control device 320 can be implemented as an N-channel MOSFET that includes a biasing gate voltage Vcontrol. The charge control device 320 in this embodiment includes an n-type threshold Vnt and the initial charge voltage is defined as the difference between Vcontrol on 320 and the threshold voltage of the device 320.

Figure 8:
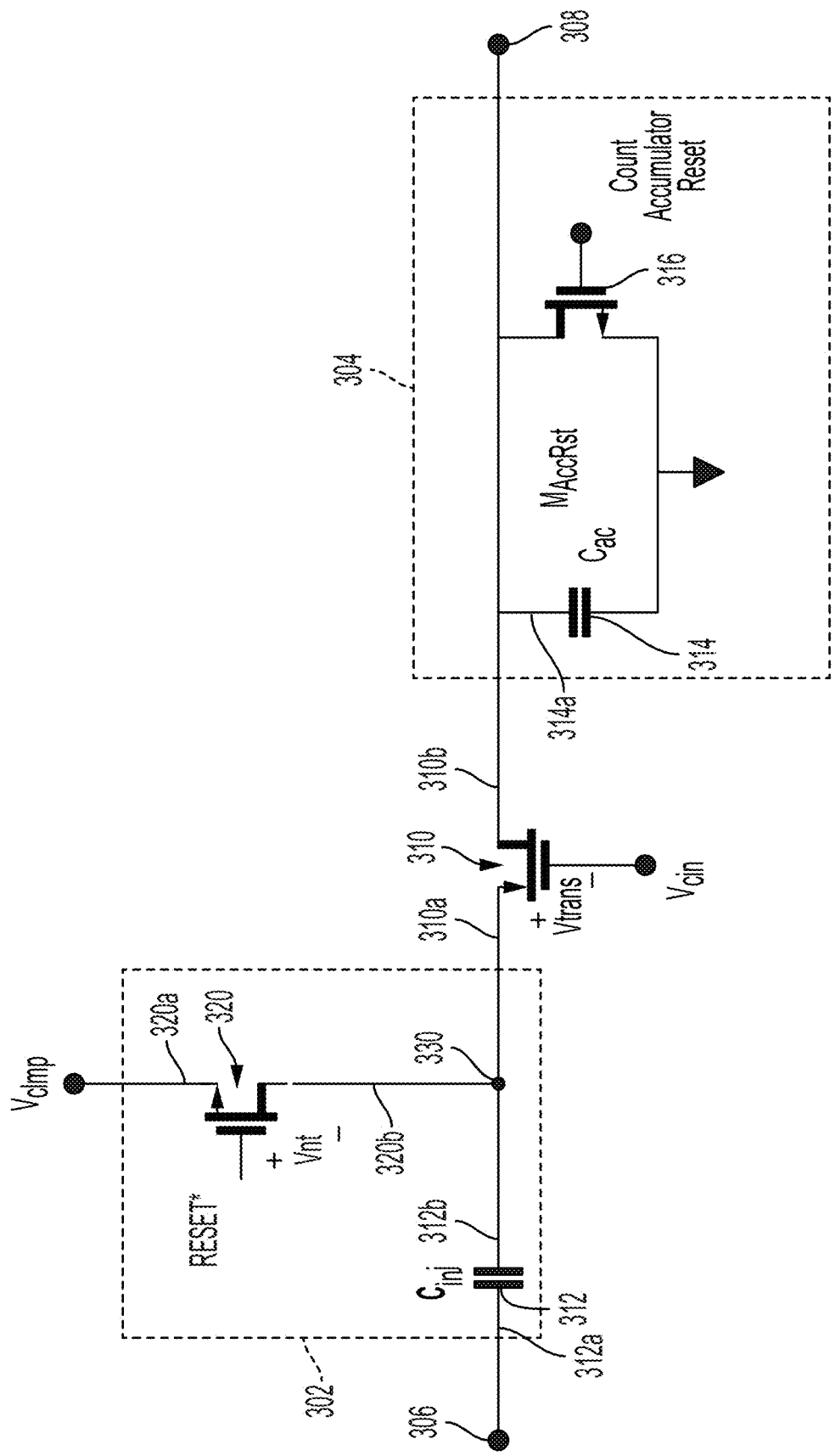
FIG. 8 is a circuit diagram of an analog counter where the charge control device of FIG. 3 is implemented as an N-channel MOSFET that is has its gate connected to a signal RESET*.

In another embodiment, and with reference now to FIG. 8, the charge control device 320 can be implemented as a N-channel MOSFET that is has its gate connected to a signal RESET* that is the opposite of RESET. The input 320a to the N-channel MOSFET is connected to a set voltage Vclmp. In this manner, Vhold can be charged to Vclmp−Vnt (n-type threshold of the N-channel MOSFET) each time RESET* goes high (e.g, when RESET is low). This implementation would require an in pixel non-overlapping clocking signals to be generated in pixel to achieve the charging and discharging of node 330 onto 304.

It shall be understood that the above described analog counters can be implemented as the counter 135 in FIG. 1. As such, in one embodiment, the teachings herein can be utilized to form a digital pixel. Such a pixel can include a photocurrent source 110, an injection transistor 112 connected to the photocurrent source and an integration capacitor 115 that is connected to a reset (Vreset) voltage. The comparator 120 has inputs operatively connected to the injection transistor 112 and to a reference voltage (Vref). The comparator 120 has an output on which, as discussed above, an output RESET signal is provided that has either a high or low value based on a relationship between the reference voltage and a voltage on the integration capacitor 115. In one instance, RESET is high when reference voltage is exceeded by the voltage on the integration capacitor 115. The output of the comparator 120 is connected the input of any of the analog counters discussed herein.

Figure 9:
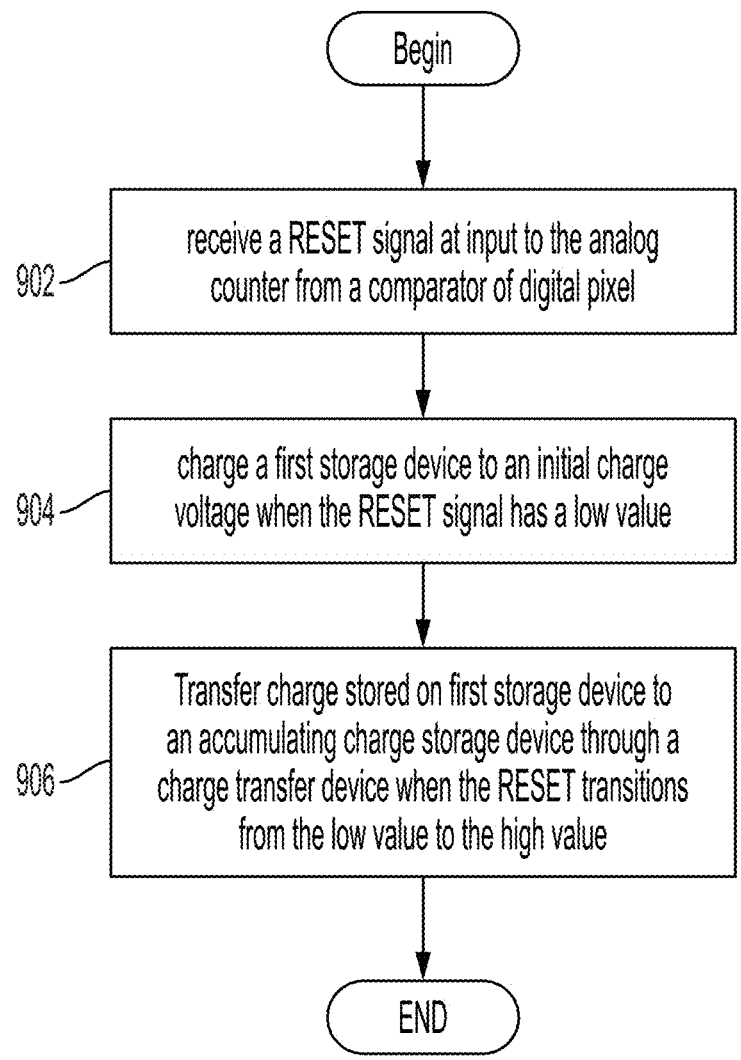
FIG. 9 is flow chart of a method according to one embodiment.

Based on the above discussion, it shall be understood that method of using an analog counter in a digital pixel circuit has been disclosed. With reference to FIG. 9, a flow chart detailing an embodiment of such a method is described. The method includes, at shown at block 902, receiving a RESET signal the input to the analog counter. The input can be received by an integration capacitor 115, for example, from comparator 120. As previously described, the comparator 120 is operatively connected to a photocurrent source 110 through an injection transistor 112 and to an integration capacitor 115. The RESET signal can include high and low values as shown above.

The method also includes, as indicated at block 904, charging a first storage device (e.g., the first capacitor 312) to an initial charge voltage when the RESET signal has a low value. The initial charge voltage is generally equal to a supply voltage minus a voltage drop across the above described charge control device 320.

The method also includes, as indicated at block 906, transferring charge stored on first storage device (i.e., the first capacitor 312) to an accumulating charge storage device (i.e., the second capacitor 314) through a charge transfer device 310 connected between the first storage device and the accumulating charge storage device when the RESET transitions from the low value to the high value for as long as a voltage (Vhold) at a node 330 between the first storage device and the charge transfer device is greater than a transfer voltage of the charge transfer device.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. An analog counter circuit for use with a digital pixel, the analog counter circuit comprising:
   an input connected to an output of a digital pixel that receives RESET signal that provides reset pulses from the digital pixel;
   an output;
   a first stage electrically coupled to the input that is charged to an initial charge voltage;
   a second stage that includes an accumulating charge storage device; and
   a charge transfer device between the first and second stages that includes a transfer voltage, wherein the charge transfer device allows charge from the first stage to pass to the second stage and be accumulated on the accumulating charge storage device as long as a voltage at a node in the first stage is greater than the transfer voltage,
   wherein the transfer device includes an input connected to the first stage and an output connected to the second stage,
   wherein the transfer device includes a gate that is connected to a constant gate bias voltage, wherein the transfer voltage is a sum of the gate bias voltage and a threshold voltage of the transfer device.

2. The analog counter circuit of claim 1, wherein when the RESET signal is received at the input transitions from a low level to a high level, the voltage at the node rises from the initial charge voltage to a charge voltage, wherein the charge voltage is a sum of the initial charge voltage and an amplitude of the RESET signal.

3. The analog counter circuit of claim 1, wherein the transfer device is a P-channel MOSFET.

4. The analog counter circuit of claim 1, wherein the first stage includes:
   a first capacitor connected to the input; and
   a charge control device having an input connected to a supply voltage and an output connected to the first capacitor.

5. The analog counter circuit of claim 4, wherein the output of the charge control device and the first capacitor are connected to the charge transfer device.

6. The analog counter of claim 4, wherein the charge control device is a diode connected P-channel MOSFET.

7. The analog counter of claim 4, wherein the charge control device is a diode connected N-channel MOSFET.

8. The analog counter of claim 4, wherein the charge control device is a diode.

9. The analog counter of claim 4, wherein the charge control device is an N-channel MOSFET.

10. The analog counter of claim 9, wherein when the RESET signal is received at the input transitions from a low level to a high level, the voltage at the node rises from the initial charge voltage to a charge voltage, wherein the charge voltage is a sum of the initial charge voltage and an amplitude of the RESET signal
    wherein a gate of the N-channel MOSFET is connected to an inverse of the RESET signal.

11. The analog counter of claim 9, wherein a gate of the N-channel MOSFET is connected to biasing gate control voltage.

12. A digital pixel including
    a photocurrent source;
    an injection transistor connected to the photocurrent source;
    an integration capacitor connected between the injection transistor and a reset voltage;
    a comparator having inputs connected to the injection transistor and to a reference voltage, the comparator having an output on which it provides an output RESET signal that has either a high or low value based on a relationship between the reference voltage and a voltage on the integration capacitor; and
    an analog counter as recited in claim 1 connected to the output of the comparator.

13. A method of using an analog counter in a digital pixel circuit, the method comprising:
    receiving a RESET signal at an input to the analog counter from a comparator operatively connected to a photocurrent source through an injection transistor and to an integration capacitor, the RESET signal having a low value and a high value;
    charging a first storage device connected to the input to an initial charge voltage when the RESET signal has a low value; and
    transferring charge stored on first storage device to an accumulating charge storage device through a charge transfer device connected between the first storage device and the accumulating charge storage device when the RESET transitions from the low value to the high value for long as a voltage at a node between the first storage device and the charge transfer device is greater than a transfer voltage of the charge transfer device;
    wherein the transfer device includes an input connected to the first storage device and an output connected to the second storage device
    wherein the transfer device includes a gate that is connected to a constant gate bias voltage, wherein the transfer voltage is a sum of the gate bias voltage and a threshold voltage of the transfer device.

14. The method of claim 13, wherein charging includes passing charge from a supply voltage to the first storage device connected the input of the analog counter through a charge control device having an input connected to the supply voltage and an output connected to the first storage device.

15. The method of claim 14, wherein the charge control is a diode connected P-channel MOSFET, a diode connected N-channel MOSFET or a diode.

16. The method of claim 14, wherein the charge control device is an N-channel MOSFET.

17. The method of claim 16, wherein charging includes one of:
    providing an inverse of the RESET signal to a gate of the an N-channel MOSFET; and
    providing a biasing gate control voltage to the gate of the an N-channel MOSFET.

* * * * *